(12) United States Patent
Sowlati et al.

(10) Patent No.: US 6,410,954 B1
(45) Date of Patent: Jun. 25, 2002

(54) MULTILAYERED CAPACITOR STRUCTURE WITH ALTERNATELY CONNECTED CONCENTRIC LINES FOR DEEP SUB-MICRON CMOS

(75) Inventors: Tirdad Sowlati; Vickram Vathulya, both of Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/546,125

(22) Filed: Apr. 10, 2000

(51) Int. Cl.[7] ........................ H01L 27/108; H01L 29/76
(52) U.S. Cl. ........................ 257/306; 257/307; 257/309
(58) Field of Search ................. 257/303, 306, 257/307, 308, 309; 438/244, 253, 255, 387, 396, 398, 399, 665, 964; 361/300–312

(56) References Cited

U.S. PATENT DOCUMENTS

| | | | |
|---|---|---|---|
| 4,427,457 A | 1/1984 | Carlson et al. | 148/1.5 |
| 5,241,201 A | 8/1993 | Matsuo et al. | 257/309 |
| 5,583,359 A | * 12/1996 | Ng et al. | 257/306 |
| 5,633,532 A | 5/1997 | Sohara et al. | 257/700 |

FOREIGN PATENT DOCUMENTS

| JP | 5558561 A | 5/1980 |
|---|---|---|
| JP | 4-318963 | * 11/1992 |

* cited by examiner

Primary Examiner—Tom Thomas
Assistant Examiner—Hung Kim Vu (57) ABSTRACT

A capacitor structure having a first and at least a second level of electrically conductive concentric lines of an open-loop configuration. The conductive lines of the at least second level overlie the conductive lines of the first level. A dielectric material is disposed between the first and second levels of conductive lines and between the conductive lines in each of the first and second levels. The conductive lines are electrically connected in an alternating manner to terminals of opposing polarity so that capacitance is generated between adjacent lines in each level and in adjacent levels. The capacitor especially useful in deep sub-micron CMOS.

12 Claims, 7 Drawing Sheets

MULTILAYERED CAPACITOR STRUCTURE WITH ALTERNATELY CONNECTED CONCENTRIC LINES FOR DEEP SUB-MICRON CMOS

RELATED APPLICATIONS

Commonly-assigned, copending U.S. patent application, Ser. No. 09/545,785, entitled "Interdigitated Multilayer Capacitor Structure For Deep Sub-Micron CMOS", filed Apr. 7, 2000.

Commonly-assigned, copending U.S. patent application, Ser. No. 09/542,711, entitled "Combined Transistor-Capacitor structure In Deep Sub-Micron CMOS For Power Amplifiers", filed Apr. 4, 2000.

Commonly-assigned, copending U.S. patent application, Ser. No. 09/596,443, entitled "Multilayer Pillar Array Capacitor Structure For Deep Sub-Micron CMOS", filed Jun. 19, 2000.

Commonly-assigned, U.S. patent application, Ser. No. 09/542,712, entitled "Multilayer Capacitor Structure Having An Array Of Concentric Ring-Shaped Plates For Deep Sub-Micron CMOS", filed Apr. 4, 2000, U.S. Pat. No. 6,297,524.

FIELD OF THE INVENTION

This invention relates to capacitor structures for metal-oxide-semiconductors (MOS), and in particular, to a capacitor structure for deep sub-micron complementary metal-oxide semiconductors (CMOS), formed by multiple levels of electrically conductive concentric lines.

BACKGROUND OF THE INVENTION

Figure 1:
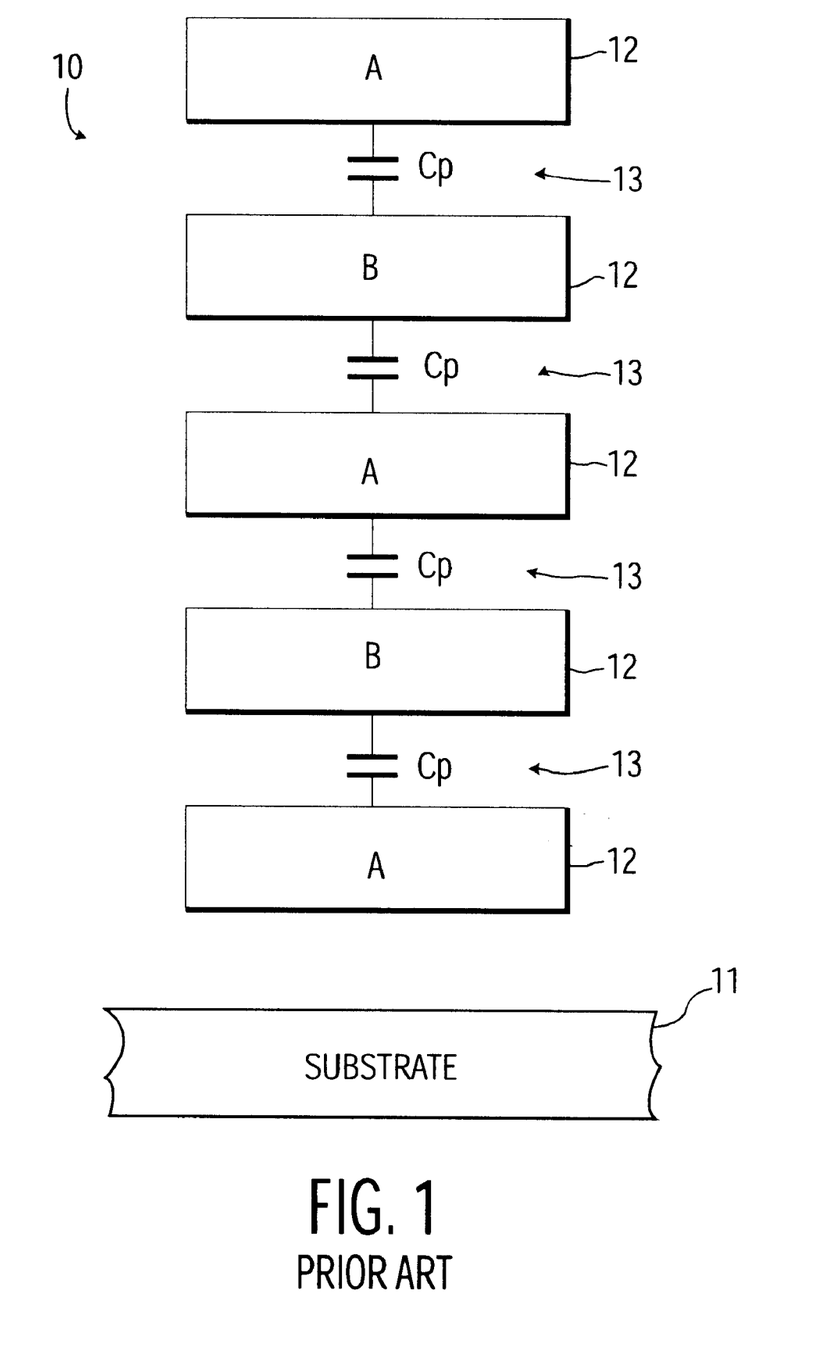
FIG. 1 is an elevational side view of a conventional parallel plate capacitor structure in a deep sub-micron CMOS.

Conventional capacitor structures for deep sub-micron CMOS are typically constructed with two flat parallel plates separated by a thin dielectric layer. The plates are formed by layers of conductive material, such as metal or polysilicon. The capacitor structure is usually isolated from the substrate by an underlying dielectric layer. To achieve high capacitance density in these structures, additional plates are provided. FIG. 1 illustrates a conventional multilayer parallel plate capacitor structure 10 in a deep sub-micron CMOS. The capacitor structure 10 includes a vertical stack of electrically conductive lines 12 separated by dielectric layers 13. The conductive lines 12 and dielectric layers 13 are constructed over a semiconductor substrate 11. The conductive lines 12 form the plates or electrodes of the capacitor 10. The plates 12 are electrically connected together in an alternating manner such that all the "A" plates are of a first polarity and all the "B" plates are of a second polarity, opposite to the first polarity.

A major limitation associated with parallel plate capacitor structures is that the minimum distance between the plates does not change as geometries in CMOS processes are scaled down. Hence, gains in capacitance density are not realized during such down scaling.

Various other capacitor structures with high capacitance densities, such as double polysilicon capacitors and gate-oxide capacitors, are known in the art. Double polysilicon capacitors, however, do not lend themselves to deep sub-micron CMOS processes. Gate-oxide capacitors are generally not used in deep sub-micron CMOS processes because they have large gate areas which cause yield and reliability issues, they generate capacitances which vary with voltage, and may experience high voltages that can breakdown the gate-oxide.

Trench capacitor structures for dynamic random access memories (DRAMs) have high capacitance densities. Such capacitors are formed by etching a trench in the substrate and filling the trench with conductive and dielectric material to form a vertical capacitance structure. However, trench capacitors are costly to fabricated because they add etching and trench filling processes.

Interdigitated capacitor structures are used in microwave applications. These capacitors have closely placed, inter-digitated conductive line structures which produce fringing and crossover capacitances therebetween to achieve capacitance. However, the cross-over capacitance produced by interdigitated capacitors is limited to a single conductor level.

Accordingly, a need exists for an improved high capacitance density capacitor structure for deep sub-micron CMOS.

SUMMARY OF THE INVENTION

A capacitor structure comprising a first and at least a second level of electrically conductive concentric lines. The conductive lines of the at least second level overlie the conductive lines of the first level. A dielectric material is disposed between the first and second levels of conductive lines and between the conductive lines in each of the first and second levels. The conductive lines are electrically connected in an alternating manner to terminals of opposing polarity so that capacitance is generated between adjacent lines in each level and in adjacent levels. The capacitor especially useful in deep sub-micron CMOS.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not to scale.

DETAILED DESCRIPTION OF THE INVENTION

Figure 2:
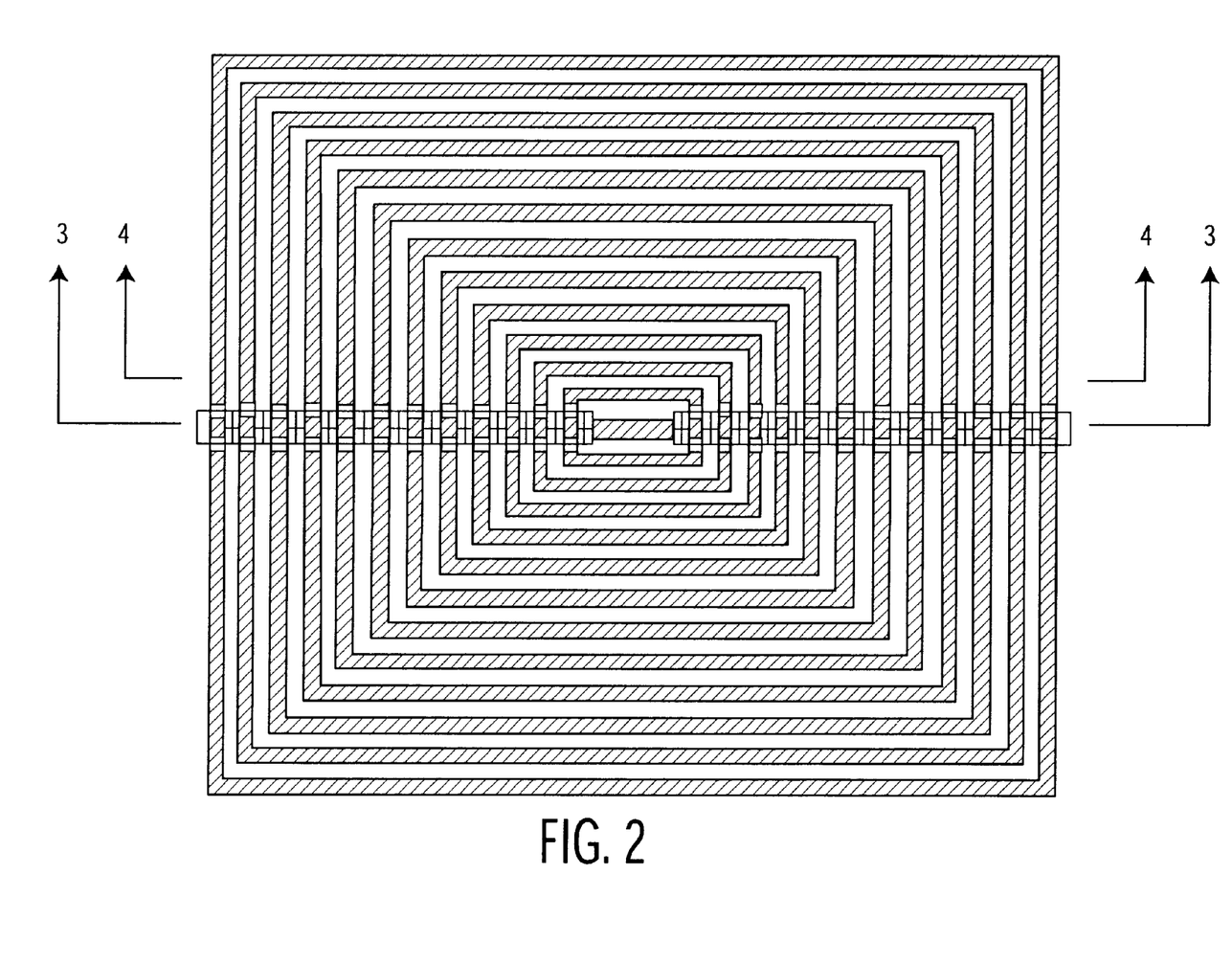
FIG. 2 is a top plan view of a capacitor structure according to an embodiment of the invention for generating capacitance in deep sub-micron CMOS.

FIG. 2 illustrates a capacitor structure 20 according an embodiment of the invention for generating capacitance in deep sub-micron CMOS. The capacitor structure 20 has a capacitance density which is significantly greater than that of a conventional parallel plate capacitor structure.

Figure 3:
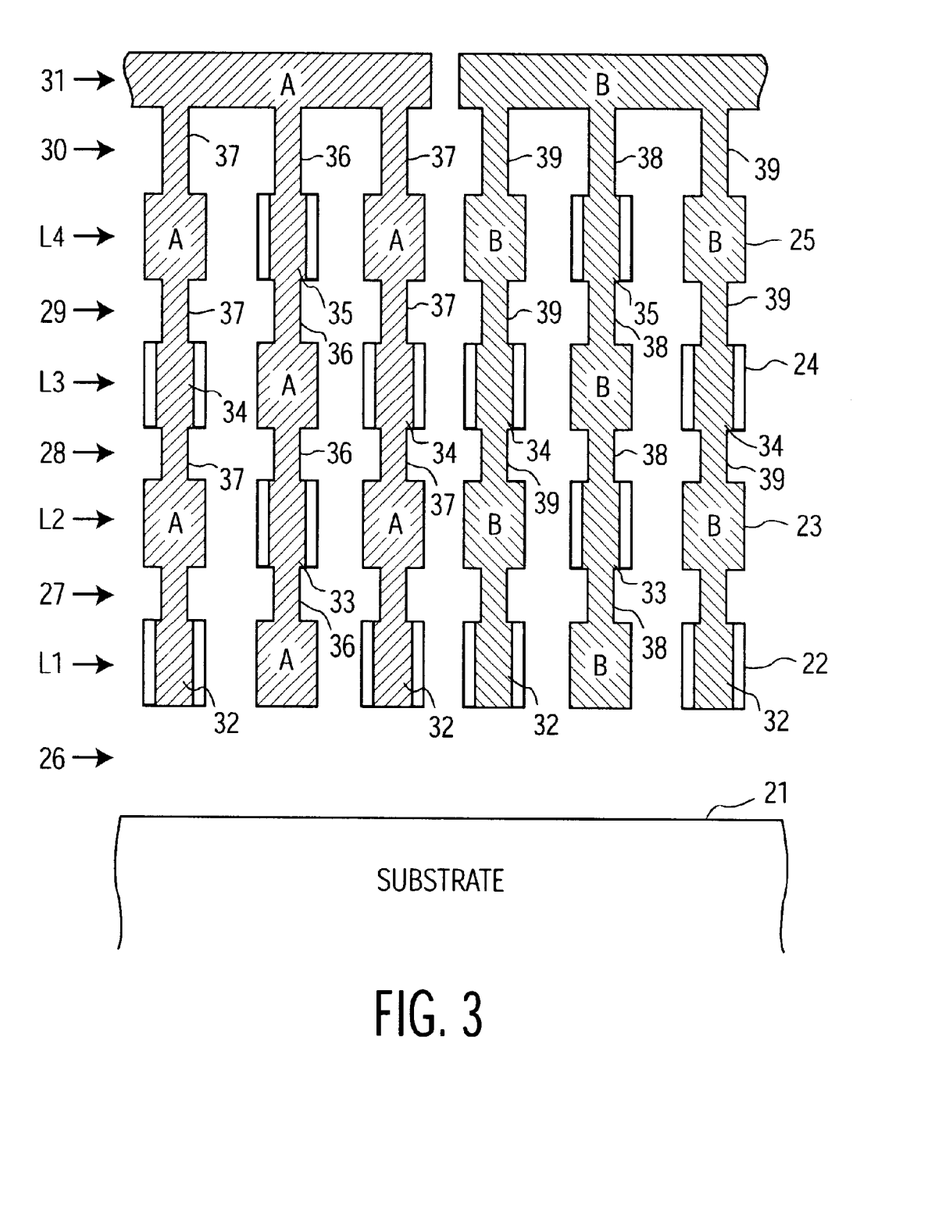
FIG. 3 is a sectional view through line 3—3 of FIG. 2.
Figure 4:
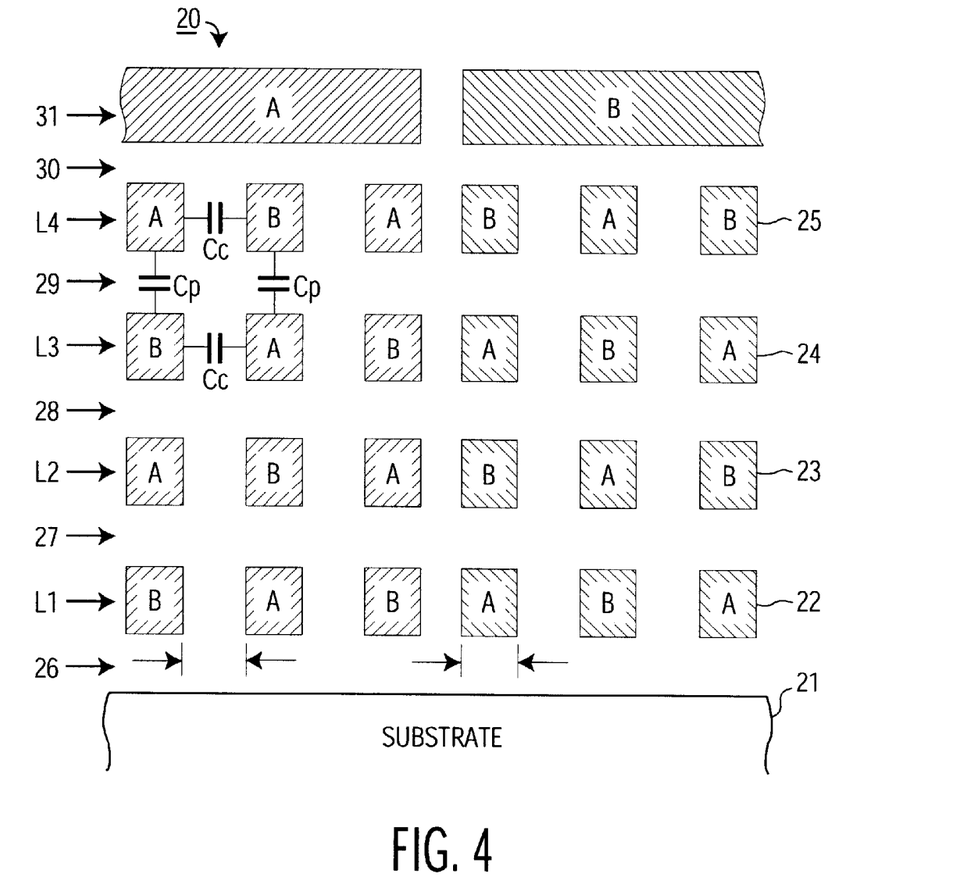
FIG. 4 is a sectional view through line 4—4 of FIG. 2.
Figure 5A:
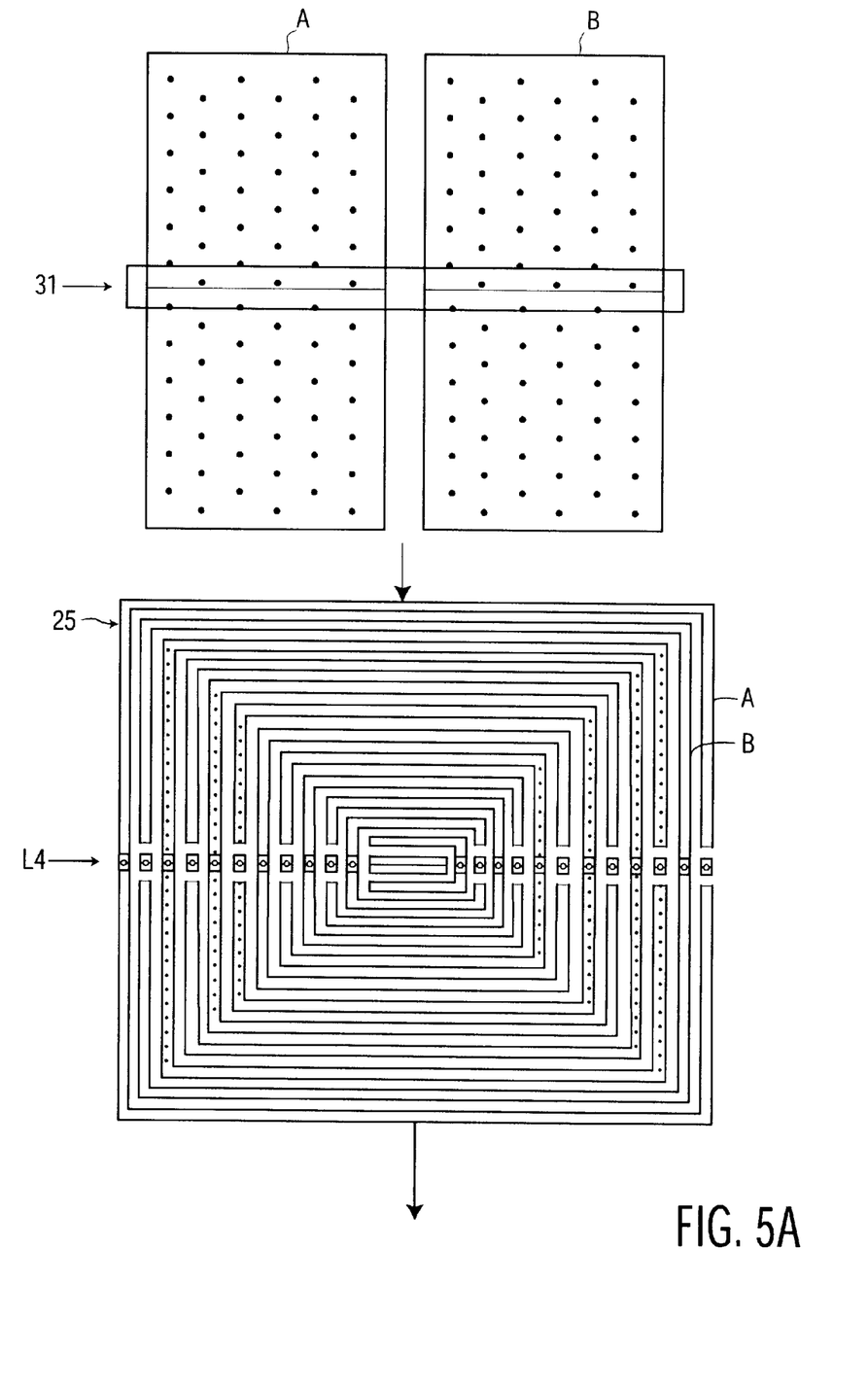
FIG. 5 is an exploded view of the capacitor structure of FIG. 2 with each of the conductor levels rotated about 90 degrees to provide a top plan view of each level.
Figure 5B:
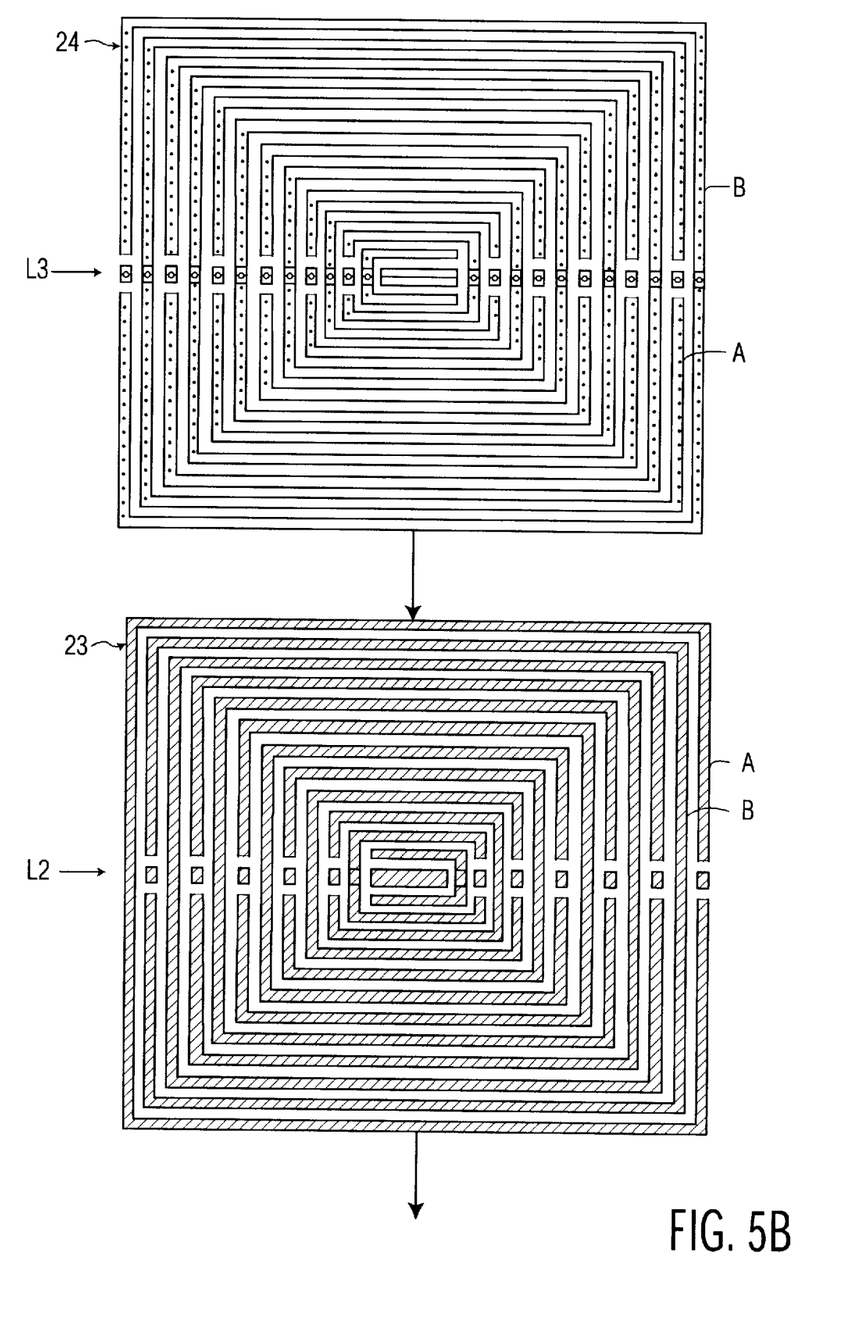
Figure 5C:
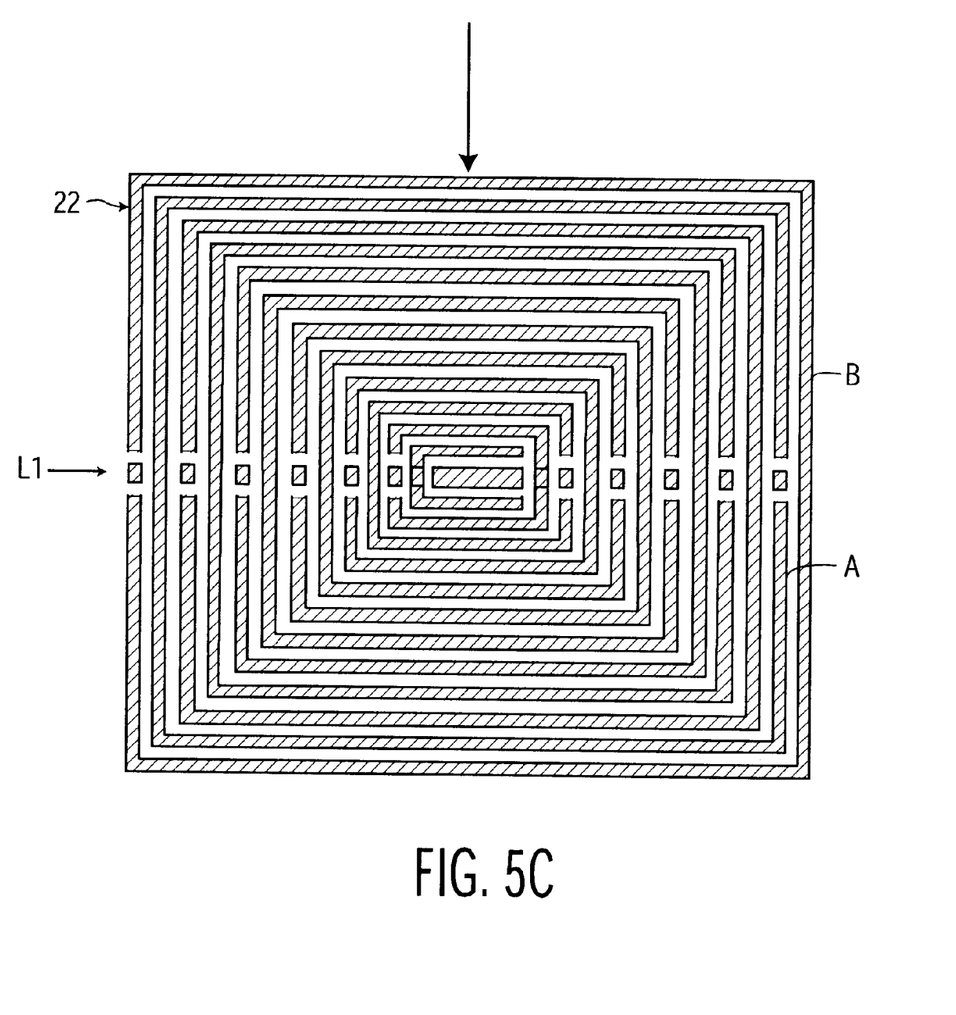

As illustrated in FIGS. 3–5, the capacitor structure 20 is constructed over a substrate 21 of semiconductor material in a multiple conductor level process (four electrical conductor levels L1–L4 are depicted for illustrative purposes only). The first conductor level L1 includes a first concentric array of electrically conductive lines 22, the second conductor level L2 includes a second concentric array of electrically conductive lines 23, the third conductor level L3 includes a third concentric array of electrically conductive lines 24, and the fourth conductor level L4 includes a fourth concentric array of electrically conductive lines 25. The conductive lines 22–25 have an open-loop configuration formed in a rectangular geometry, however, they can also be formed in other geometries such as square, octagonal, or circular to name a few. In present state-of-the-art deep sub-micron CMOS technology, conductive line spacings of about 0.5 microns or less is common. Thus, the minimum distance between the concentric conductive lines in each conductor level of the capacitor of the invention is typically equal to or less than about 0.5 microns.

As illustrated in FIGS. 3 and 4, a first dielectric layer 26 fills the space between the substrate 21 and the first conductor level L1; a second dielectric layer 27 fills the space between the first and second conductor levels L1, L2 and the spaces between the concentric lines 22 of the first conductor level L1; a third dielectric layer 28 fills the space between the second and third conductor levels L2, L3 and the spaces between the concentric lines 23 of the second level L2; a fourth dielectric layer 29 fills the space between the third and fourth conductor levels L3, L4 and the spaces between the concentric lines 24 of the third conductor level L3; and a fifth dielectric layer 30 fills the space between the fourth conductor level and a contact layer 31, and the spaces between the concentric lines 25 of the fourth conductor level L4. The concentric lines 22–25 are oriented such that any two adjacent lines horizontally in each level, or vertically in adjacent conductor levels, have openings 32, 33, 34, 35 which are oppositely positioned. Disposed in the openings 32–35 are conductive line segments 36, 37, 38, 39. The conductive lines 23–25 and line segments 37–39 in the second, third and fourth levels L2–L4 substantially overlie corresponding lines 22 and lines segments 36 in the first level L1. Each individual conductive line 22–25 forms an electrode or capacitor plate.

The alternating horizontal and vertical positioning of the conductive line openings 32–35 permit the conductive lines 22–25 to be electrically connected such that any two adjacent lines within a level, or in adjacent conductor levels, have opposite electrical polarities A and B. Hence, all the A conductive lines 22, 24 in the first and third conductor levels L1 and L3 can be electrically interconnected to a first terminal A in the contact layer 31 with a first set of vias 40 that extend through the second, third, fourth and fifth dielectric layers 27–30 and electrically contact the conductive line segments 37, 39 disposed in the openings 33, 35 of the B conductive lines of the second and fourth conductor levels L2 and L4. All the A conductive lines 23, 25 in the second and fourth conductor levels L2 and L4 can be electrically interconnected to the first terminal A with a second set of vias 41 that extend through the third, fourth and fifth dielectric layers 28–30 and electrically contact the conductive line segments 38 disposed in the openings 34 of the B conductive lines 24 of the third conductor level L3. All the B conductive lines 22, 24 in the first and third conductor levels L1 and L3 can be electrically interconnected to a second terminal B in the contact layer 31 with a third set of vias 42 that extend through the second, third, fourth and fifth dielectric layers 27–30 and electrically contact the conductive line segments 37, 39 disposed in the openings 33, 35 of the A conductive lines of the second and fourth conductor levels L2 and L4. All the B conductive lines 23, 25 in the second and fourth conductor levels L2 and L4 can be electrically interconnected to the second terminal B with a fourth set of vias 43 that extend through the third, fourth and fifth dielectric layers 28–30 and electrically contact the conductive line segments 38 disposed in the openings 34 of the A conductive lines of the third conductor level L3.

FIG. 5 best illustrates the alternating polarites of any two adjacent lines within a level, or in adjacent conductor levels. In level L1, the outermost conductive line 22 is an A polarity line and the next conductive line 22 moving inwardly is a B polarity line and so on. In level L2, the outermost conductive line 23 is a B polarity line and the next conductive line 23 moving inwardly is an A polarity line and so on. In level L3, the outermost conductive line 24 is an A polarity line and the next conductive line 24 moving inwardly is a B polarity line and so on. In level L4, the outermost conductive line 25 is a B polarity line and the next conductive line 23 moving inwardly is an A polarity line and so on.

The capacitor structure of the invention has a capacitance density which is about three times that of a conventional parallel plate capacitor structure, because it generates parallel capacitance $C_p$ between the conductive lines in the multiple conductor levels and cross-over capacitance $C_c$ between adjacent concentric conductive lines in each of the conductor levels.

The improvement in capacitance density can be seen by comparing the capacitance of a conventional parallel plate capacitor similar to the one shown in FIG. 1 constructed with five (5) plates and having dimensions of 19.8 microns× 25.4 microns, with a capacitor made according to the invention constructed with 5 conductor levels and having dimensions of 19.8 microns×25.4 microns. Both capacitors were constructed in a 0.25 micron CMOS process. The parallel plate capacitor structure had a capacitance of about 86 fF and a capacitance per unit area of about 0.17 fF/$\mu$m$^2$. In comparison, the capacitor made according to the invention had a capacitance of about 273 fF and a capacitance per unit area of about 0.54 fF/$\mu$m$^2$.

The capacitance density of the capacitor structure of the invention will advantageously increase as the geometries in semiconductor process technologies continue to shrink and scale down because the minimum width $M_w$ of the concentric lines and the minimum distance $M_d$ between concentric lines in each of the levels will advantageously decrease.

Such capacitance increases are not possible in conventional multilayer parallel plate capacitor structures because the heights or thicknesses of the conductor and dielectric levels do not scale down. Hence, the distance between the plates will remain about 1 micron in conventional parallel plate capacitor structures.

The capacitor structure of the invention is typically manufactured in silicon using conventional deep sub-micron CMOS processing. The capacitor structure of the invention can also be manufactured in gallium arsenide or any other suitable semiconductor system using conventional deep sub-micron processing. Manufacturing in silicon using deep sub-micron CMOS processing, usually involves growing or depositing a first layer of silicon dioxide on a selected portion of the silicon semiconductor substrate to form the first dielectric layer. The silicon dioxide layer has a thickness in the range of about one micron. A first layer of metal, such as aluminum, or highly conductive polysilicon, is deposited on the first dielectric layer of silicon dioxide and then defined into the concentric conductive lines and line segments using well known masking and dry etching techniques to form the first conductor level. As mentioned above, the width and spacing of the conductive lines are set to the minimum dimensions of the process to enhance the capacitance of the structure, i.e., the lines and spacing between the lines are as narrow as possible.

A second layer of silicon dioxide is then grown or deposited over the conductive lines to form the second dielectric layer. The thickness of the second dielectric layer of silicon dioxide is in the range of about one micron. A plurality of holes, which extend down to the first conductor level are defined in the second dielectric layer of silicon dioxide and then filled with metal or polysilicon using conventional via fabrication techniques to form the vertically extending vias in the second dielectric layer. A second layer of metal, such as aluminum, or polysilicon, is deposited on the second dielectric layer of silicon dioxide and then defined into the concentric conductive lines and the line segments of the second conductor level. The remaining dielectric layers, vias, conductor levels, and conductive lines and conductive line segments, are fabricated in the same manner as described above.

One of ordinary skill in the art will recognized that specialized dielectric materials can be used in place of silicon dioxide (silicon systems) or silicon nitride (galium arsenide systems) to form the dielectric layers. For example a ferro-electric ceramic, such as PLZT (lanthanum-modified lead zirconate tantalate) can be used to form the dielectric layers. The use of PLZT layers greatly enhances capacitance as PLZT has a dielectric constant of approximately 4,700, in contrast to 3.9 for the dielectric constant of silicon dioxide.

The ordinary skill artisan will further recognize that the capacitor of the invention can be useful in many applications, such as RF, analog and digital applications. RF circuit applications employ capacitors for matching. The larger the capacitance per unit area, the smaller the area and the lower the cost. In analog circuit applications, undesirable noise can often be reduced by using large capacitors (KT/C). In digital circuit applications, large decoupling capacitances are often very important and can be easily provided with the capacitor of the invention.

While the foregoing invention has been described with reference to the above embodiment, additional modifications and changes can be made without departing from the spirit of the invention. Accordingly, all such modifications and changes are considered to be within the scope of the appended claims.

What is claimed is:

1. A capacitor comprising:
    a first conductor level of electrically conductive concentric lines;
    at least a second conductor level of electrically conductive concentric lines, the concentric lines of the at least second conductor level substantially overlying corresponding concentric lines of the first level;
    a dielectric material disposed between the first and second conductor levels and between the concentric lines in each of the levels; and
    electrically opposing terminals;
    wherein the conductive lines are electrically connected in an alternating manner to terminals of opposing polarity so that capacitance is generated between adjacent conductive lines in each level and in adjacent levels.

2. The capacitor according to claim 1, wherein the conductive lines of each level have an open-loop configuration.

3. The capacitor according to claim 1, wherein adjacent conductive lines in each level have opposing openings.

4. The capacitor according to claim 1, wherein adjacent conductive lines in adjacent levels have opposing openings.

5. The capacitor according to claim 1, wherein adjacent conductive lines in each level have opposing openings, and adjacent conductive lines in adjacent levels have opposing openings.

6. The capacitor according to claim 1, wherein the capacitor is constructed over a substrate.

7. The capacitor according to claim 6, wherein the substrate is made from a semiconductor material.

8. The capacitor according to claim 1, wherein the capacitor comprises a sub-micron MOS structure.

9. The capacitor according to claim 1, wherein the capacitor comprises a sub-micron CMOS structure.

10. The capacitor of claim 1, wherein the capacitor comprises a sub-micron structure.

11. The capacitor according to claim 1, wherein the conductive lines are made from one of a metal material and conductive semiconductor material.

12. The capacitor according to claim 1, wherein the at least second conductor level of electrically conductive concentric lines comprises a plurality of conductor levels of electrically conductive concentric lines, the conductive lines of the plurality of conductor levels substantially overlying corresponding conductive lines of the first level.

* * * * *